United States Patent
Bouchez et al.

(10) Patent No.: US 9,455,571 B2
(45) Date of Patent: Sep. 27, 2016

(54) POWER LIMITER

(71) Applicant: TriQuint Semiconductor, Inc., Hillsboro, OR (US)

(72) Inventors: Joseph J. Bouchez, McKinney, TX (US); Tuong Nguyen, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/978,346

(22) Filed: Dec. 22, 2015

(65) Prior Publication Data

US 2016/0111873 A1   Apr. 21, 2016

Related U.S. Application Data

(62) Division of application No. 13/801,929, filed on Mar. 13, 2013, now Pat. No. 9,270,246.

(51) Int. Cl.
*H04B 1/06* (2006.01)
*H02H 9/04* (2006.01)
*H03G 11/02* (2006.01)

(52) U.S. Cl.
CPC ............. *H02H 9/045* (2013.01); *H03G 11/02* (2013.01)

(58) Field of Classification Search
None
See application file for complete search history.

(56) References Cited

U.S. PATENT DOCUMENTS

| | | |
|---|---|---|
| 5,038,113 A | 8/1991 | Katz et al. |
| 5,059,892 A | 10/1991 | Stoft |
| 5,140,287 A | 8/1992 | Hawkes |
| 5,349,644 A | 9/1994 | Massey et al. |
| 5,414,313 A | 5/1995 | Crescenzi, Jr. et al. |
| 7,181,146 B1 | 2/2007 | Yorks |
| 7,750,753 B1 * | 7/2010 | Cadotte, Jr. ........... H01L 31/162 333/17.2 |
| 8,000,668 B2 | 8/2011 | Boguslavskij et al. |
| 8,149,742 B1 | 4/2012 | Sorsby |
| 2002/0180552 A1 * | 12/2002 | Bennett .................. H03G 11/02 333/17.2 |
| 2004/0174226 A1 * | 9/2004 | Bennett .................. H03G 11/02 333/17.2 |
| 2007/0149147 A1 | 6/2007 | Kishimoto et al. |
| 2009/0065696 A1 | 3/2009 | Mann et al. |
| 2009/0322442 A1 * | 12/2009 | Maas ................... H03G 11/025 333/17.2 |
| 2012/0001305 A1 | 1/2012 | Peroni et al. |
| 2012/0074367 A1 | 3/2012 | Costa et al. |
| 2013/0278351 A1 | 10/2013 | Bao et al. |

OTHER PUBLICATIONS

Cory, Rick, "PIN-limiter diodes effectively protect receivers," EDN, Dec. 17, 2004, pp. 59-66.

Santhakumar, Raj et al., "High Performance Ka-Band VPIN Limiters," Compound Semiconductor Integrated Circuit Symposium, Oct. 2012, 4 pages.

Non-Final Office Action for U.S. Appl. No. 13/801,929, mailed May 12, 2015, 8 pages.

Notice of Allowance for U.S. Appl. No. 13/801,929, mailed Oct. 14, 2015, 7 pages.

* cited by examiner

*Primary Examiner* — Lana N Le (74) *Attorney, Agent, or Firm* — Withrow & Terranova, P.L.L.C.

(57) ABSTRACT

Embodiments provide a limiter circuit that includes a power splitter coupled with a plurality of antiparallel diode pairs. In some embodiments, the power splitter may be part of a first stage of the limiter circuit. Other embodiments may be described and claimed.

20 Claims, 7 Drawing Sheets

POWER LIMITER

This application is a divisional application of, and claims priority to, U.S. patent application Ser. No. 13/801,929, entitled "Power Limiter", filed Mar. 13, 2013, the disclosure of which is incorporated herein by reference in its entirety.

FIELD

Embodiments of the present disclosure relate generally to the field of power limiters, and more particularly to a power limiter having a power splitter at an input stage.

BACKGROUND

Power limiters may be used in a receive chain to protect low-noise amplifiers (LNAs) or other sensitive components from an radio frequency (RF) signal having a high input power. Power limiters are designed to have a low insertion loss when RF signals having input powers below a certain threshold are received, and a high insertion loss when RF signals having input powers above a certain threshold are received. Power limiters often employ diodes to provide the desired functionality.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

As discussed above, power limiters are often employed to protect LNAs or other sensitive components from RF signals having high input powers. Power limiters may have multiple stages of antiparallel diode pairs coupled with a transmission line. However, the antiparallel diode pair of the input stage, that is, the stage closest to an input node that receives the RF signal from the antenna, may be prone to burn out due to high current levels at the input node. Embodiments of the present disclosure provide the input stage with a power splitter that may distribute the RF signal power among a plurality of antiparallel diode pairs. In this way, the diodes of the input stage may be less susceptible to failure caused by high currents at the input node.

Figure 1:
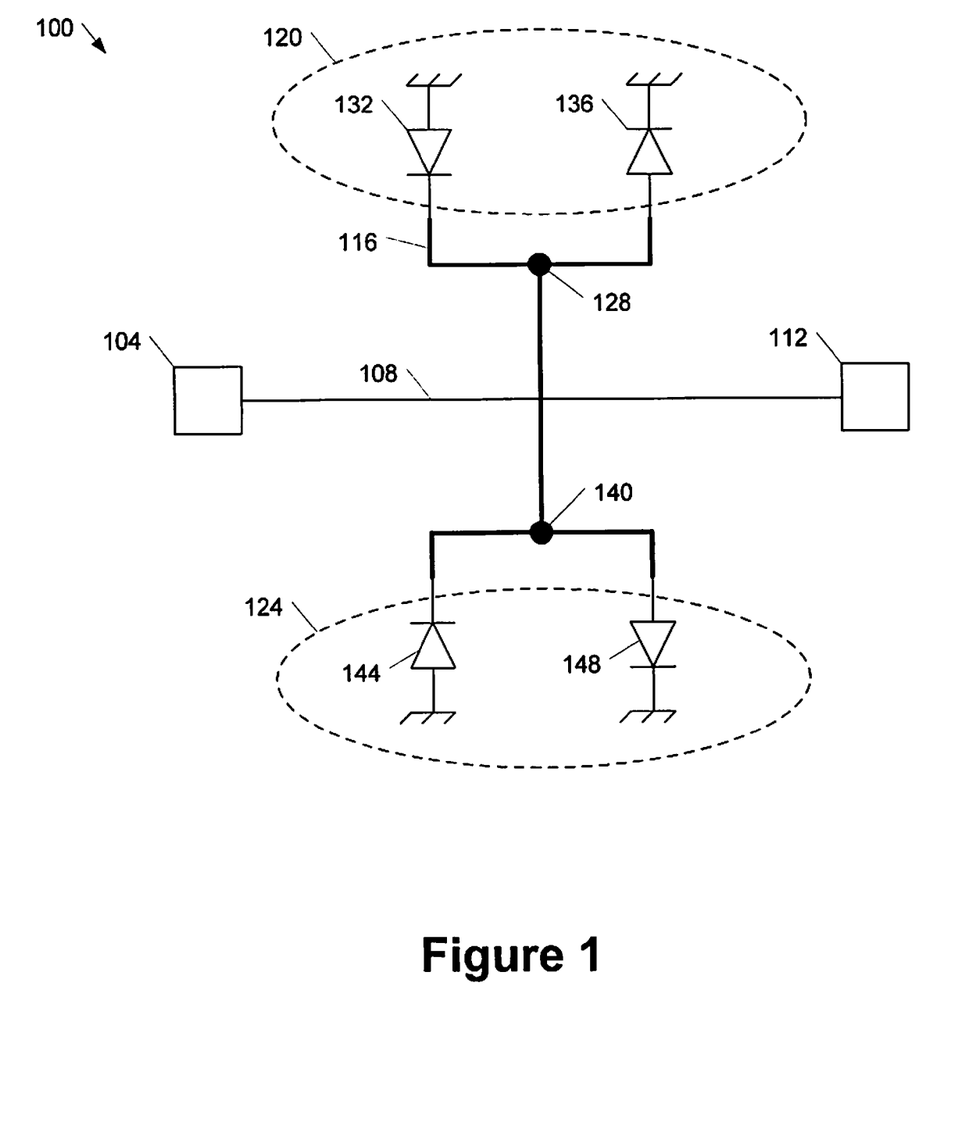
FIG. 1 illustrates a limiter circuit in accordance with some embodiments.
Figure 5:
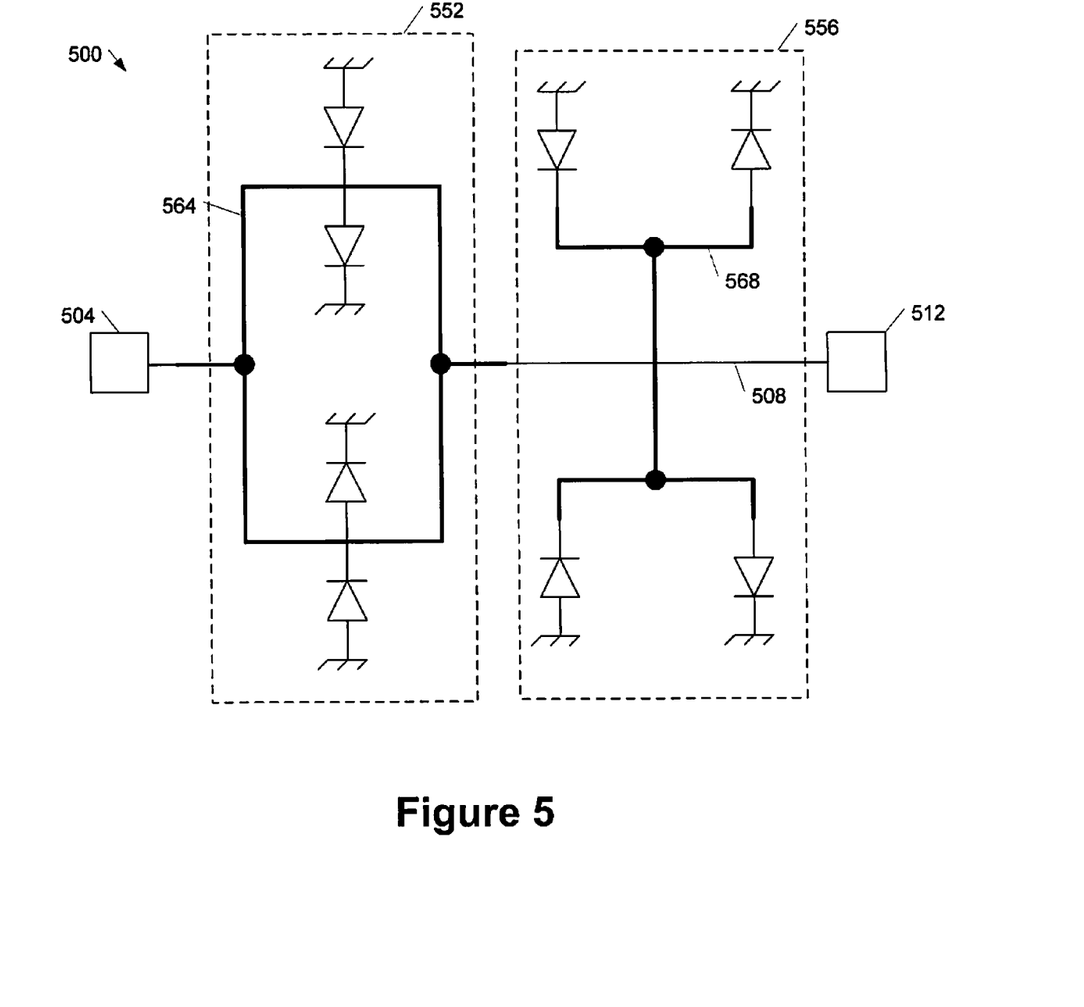
FIG. 5 illustrates a limiter circuit in accordance with some embodiments.

FIG. 1 illustrates a power limiter circuit 100 in accordance with some embodiments. The power limiter circuit 100, also referred to as limiter 100, may include an input node 104, a transmission line 108 coupled with the input node 104, and an output node 112 coupled with the transmission line 108. The input node 104, which may be a pin or pad, for example, may be configured to be coupled with an antenna (possibly through duplexer as shown in FIG. 5) that is to receive an RF signal and provide the RF signal to the input node 104. The output node 112, which may be a pin or pad, for example, may be configured to be coupled with one or more components of a host device that would be otherwise susceptible to damage from high power RF input signals.

The limiter 100 may be a single-stage limiter having a power splitter 116 coupled with the transmission line 108 between the input node 104 and the output node 112. The power splitter 116 is shown in a heavier weight line than the transmission line 108.

The power splitter 116 may be coupled with a first diode pair 120 and a second diode pair 124. In particular, the power splitter 116 may include a node 128 coupled with and between diodes 132 and 136 of the first diode pair 120; and a second node 140 coupled with and between diodes 144 and 148 of the second diode pair 124. While only one diode is shown on each branch, it may be understood that a plurality of diodes may be coupled in series with one another. This may be done, for example, to increase RF power handling capability. Further, in some embodiments, other circuit elements that function as a diode, for example, a diode-connected transistor, may be used in place of the diodes shown.

The diodes 132 and 136 of the diode pair 120 may be coupled in parallel with one another, but with their polarities reversed. Thus, the diode pair 120 may also be referred to as antiparallel diode pair 120. A cathode of the diode 132 may be coupled with the node 128, while an anode of the diode 132 may be coupled with ground. Further, an anode of the diode 136 may be coupled with the node 128, while a cathode of the diode 136 may be coupled with ground.

The diodes 144 and 148 of the second diode pair 124 may also be couple in parallel with one another with their polarities reversed and, therefore, be referred to as antiparallel diode pair 124. A cathode of diode 144 may be coupled with node 140 and an anode of diode 144 may be coupled with ground. Further, an anode of diode 148 may be coupled with node 140 and a cathode of diode 148 may be coupled with ground.

While FIG. 1 illustrates each of the diodes being coupled with a ground, they may not be so coupled in other embodiments. For example, in place of the ground connection, a positive or negative voltage supply may be provided to reverse or forward bias the diodes. Reverse biasing the diodes may increase an input power to turn on the diodes. Forward biasing the diodes may lower the input power to turn on the diodes. In such a manner, the limiter 100 may be configured as a variable input power limiter.

In some embodiments, the antiparallel diode pairs 120 and 124 may be physically disposed on opposite sides of the transmission line 108 from one another as shown in FIG. 1.

If power of an RF signal on the transmission line 108 has an amplitude less than a certain threshold, the diodes 132, 136, 144, and 148 may present a high resistance and, therefore, the limiter 100 may be associated with a low insertion loss. However, if the power of the RF signal has an amplitude over the threshold, the diodes 132, 136, 144, and 148 may be forward biased and the antiparallel diode pairs 120 and 124 may function to limit the peak voltage of positive and negative signal alterations of the RF signal.

Providing the power splitter 116, as shown, may evenly distribute the power provided to the antiparallel diode pairs 120 and 124 so that each antiparallel diode pair has the same resistance. This may lower the input resistance of the limiter 100 to increase power reflected by the diodes 132, 136, 144, and 148 and, therefore, reduce power dissipated by the diodes 132, 136, 144, and 148. This may allow the limiter 100 to handle higher input powers, with respect to previous limiter designs, before burnout of any of the diodes 132, 136, 144, and 148.

The diodes 132, 136, 144, 148 may be of equal sizes or different sizes. In some embodiments, the diodes 144 and 132 may be different sizes than diodes 148 and 136, or each of the diodes 144 and 132 may represent two or more diodes in series while each of the diodes 136 and 148 may represent a lesser number of diodes in series (or just one diode). In this manner, the diodes 144 and 132 may turn on only turn on when the input power is above a first threshold, but the diodes 136 and 148 may start to limit the input power when it is above a second threshold that is lower than the first threshold.

In various embodiments, the diodes 132, 136, 144, and 148 may be vertical P-I-N (VPIN) GaAs diodes. A VPIN GaAs diode may have p-, i-, and n- GaAs layers vertically disposed on a semi-insulating GaAs substrate. The n-GaAs region, which may be the cathode, may be disposed directly on the semi-insulating GaAs substrate. The i-GaAs layer may be formed on the n-GaAs layer and the p-GaAs layer, which may be the anode, may be formed on the i-GaAs layer. The i-GaAs layer and the p-GaAs layer may form a mesa structure on top of the n-GaAs region. Contacts may be placed on portions of the n-GaAs layer and on the p-GaAs layer. In some embodiments, the contacts may be gold (Au) over nickel (Ni) contacts. The design of the VPIN GaAs diodes, including dimensions and materials, may be adjusted to provide operating characteristics (for example, resistance, capacitance, recovery time, threshold level, etc.) desirable for a particular embodiment.

A vertical PIN GaAs diode may be particularly suitable for present embodiments due to their low insertion loss and their low spike voltage. Further, VPIN diodes do not require DC power. However, in other embodiments, other types of diodes may be used.

In some embodiments, the limiter 100 may be packaged into a package having a base of aluminum nitride and a plastic lid. The package may have dimensions of approximately 2 millimeters by 2 millimeters. The package may be coupled with circuit board having other components, for example, a low noise amplifier by a solder process. In some embodiments, other attachment processes may be used.

Figure 2:
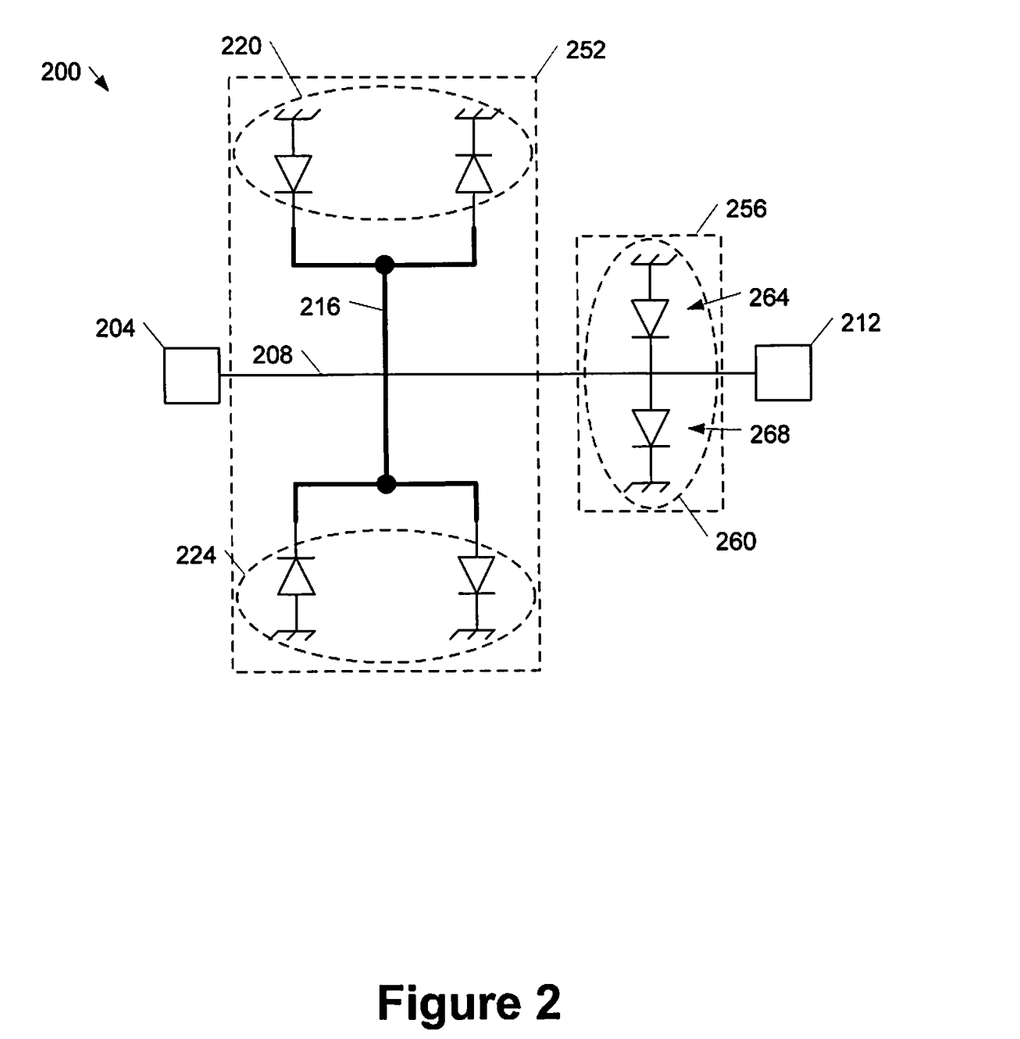
FIG. 2 illustrates a limiter circuit in accordance with some embodiments.

FIG. 2 illustrates a limiter 200 in accordance with some embodiments. Except as otherwise noted, the limiter 200 may be similar to, and substantially interchangeable with, limiter 100. Limiter 200 may be a dual-stage limiter with a first stage 252 and a second stage 256.

The first stage 252 may be coupled with input node 204 and may also be referred to as input stage 252 (or coarse stage 252). The input stage 252 may have a power splitter 216 and antiparallel diode pairs 220 and 224, similar to limiter 100.

The second stage 256 may include an antiparallel diode pair 260 that is coupled directly to the transmission line 208. The direct coupling of the antiparallel diode pair 260 may be contrasted from the coupling of the antiparallel diode pairs 220 and 224 by not being coupled to the transmission line through a power splitter such as power splitter 216.

The antiparallel diode pair 260 may include a diode 264 with a cathode coupled with the transmission line 208 and an anode coupled with ground. The antiparallel diode pair 260 may further include a diode 268 having an anode coupled with the transmission line 208 and a cathode coupled with ground. The diodes 264 and 268 may be physically disposed on opposing sides of the transmission line 208.

The first stage 252 may be responsible for a majority of the power limiting, while the second stage 256 may be responsible for determining threshold level and spike leakage of the limiter 200. Given the power limiting role of the first stage 252, it may be unnecessary to provide power splitters for later stages. However, some embodiments, such as the embodiment shown in FIG. 5, may include power splitters at additional or alternative stages of a power limiter.

The second stage 256 may be coupled with the transmission line approximately one-quarter wavelength (λ/4) from where the first stage 252 is coupled with the transmission line 208. This may result in a voltage maximum being observed by the second stage 256 when a voltage minimum is observed by the first stage 252.

In some embodiments, the diodes of the first stage 252 may generally be the same size or larger than the diodes of subsequent stages.

While limiters 100 and 200 respectively illustrate one and two stage limiters, limiters of other embodiments may have other number of stages.

Figure 3:
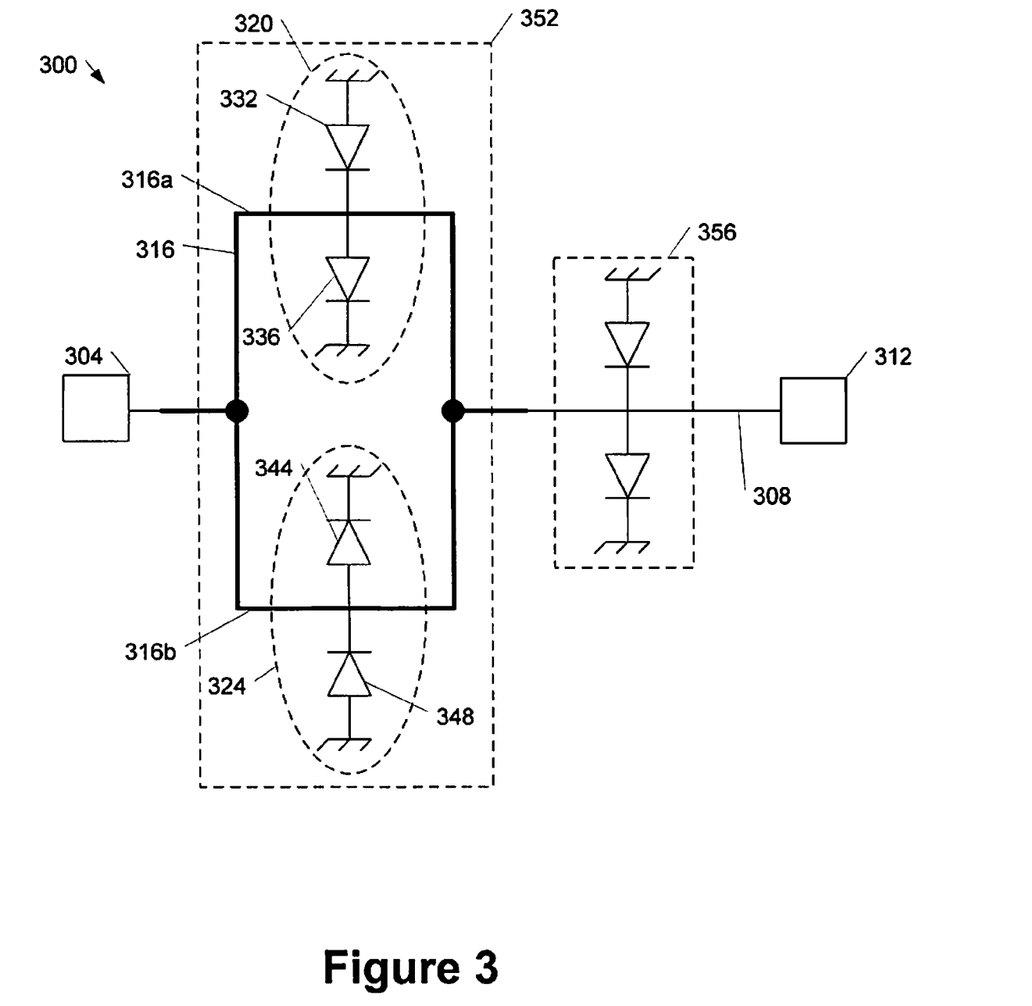
FIG. 3 illustrates a limiter circuit in accordance with some embodiments.

FIG. 3 illustrates a limiter 300 in accordance with some embodiments. Except as otherwise noted, the limiter 300 may be similar to, and substantially interchangeable with, limiters 100 or 200.

Similar to limiter 200, limiter 300 may include a first stage 352 coupled with an input node 304 and a second stage 356 coupled with an output node 312. The second stage 356 may be similar to second stage 256 of limiter 200.

The first stage 352, similar to first stage 252, may include a power splitter 316 coupled with antiparallel diode pairs 320 and 324. However, the configuration of power splitter 316 and antiparallel diode pairs 320 and 324 may differ from that of power splitter 216 and antiparallel diode pairs 220 and 224. Specifically, the power splitter 316 may include a plurality of parallel branches, shown as 316*a* and 316*b*, with the antiparallel diode pairs 320 and 324 being respectively coupled with the parallel branches 316*a* and 316*b*.

Diode 332 of antiparallel diode pair 320 may include a cathode coupled with the parallel branch 316*a* and an anode coupled with ground. Diode 336 of antiparallel diode pair 320 may include an anode coupled with the parallel branch 316*a* and a cathode coupled with ground. The diodes 332 and 336 may be physically disposed on opposing sides of the branch 316*a*.

Diode 344 of antiparallel diode pair 324 may include an anode coupled with the parallel branch 316*b* and a cathode coupled with ground. Diode 348 of antiparallel diode pair 324 may include a cathode coupled with the parallel branch 316*a* and an anode coupled with ground. The diodes 344 and 348 may be physically disposed on opposing sides of the parallel branch 316*b*.

The configuration of the power limiter 316 may allow the input power to be divided so that each antiparallel diode pair has less incident power applied, while the total required diode area in the input section remains unchanged with respect to previous limiter designs. Further, the configuration of the limiter 300 may reduce dissipation in the antiparallel diode pairs 320 and 324, which may increase power handling capacity of the limiter 300. The diodes 332, 336, 344, and 348 may be smaller than input stage diodes of previous limiter designs, allowing for higher cutoff frequencies and wider operating bandwidths.

While the limiters 100, 200, and 300 are each shown with two antiparallel diode pairs in the input stage, other embodiments may have other numbers.

Figure 4:
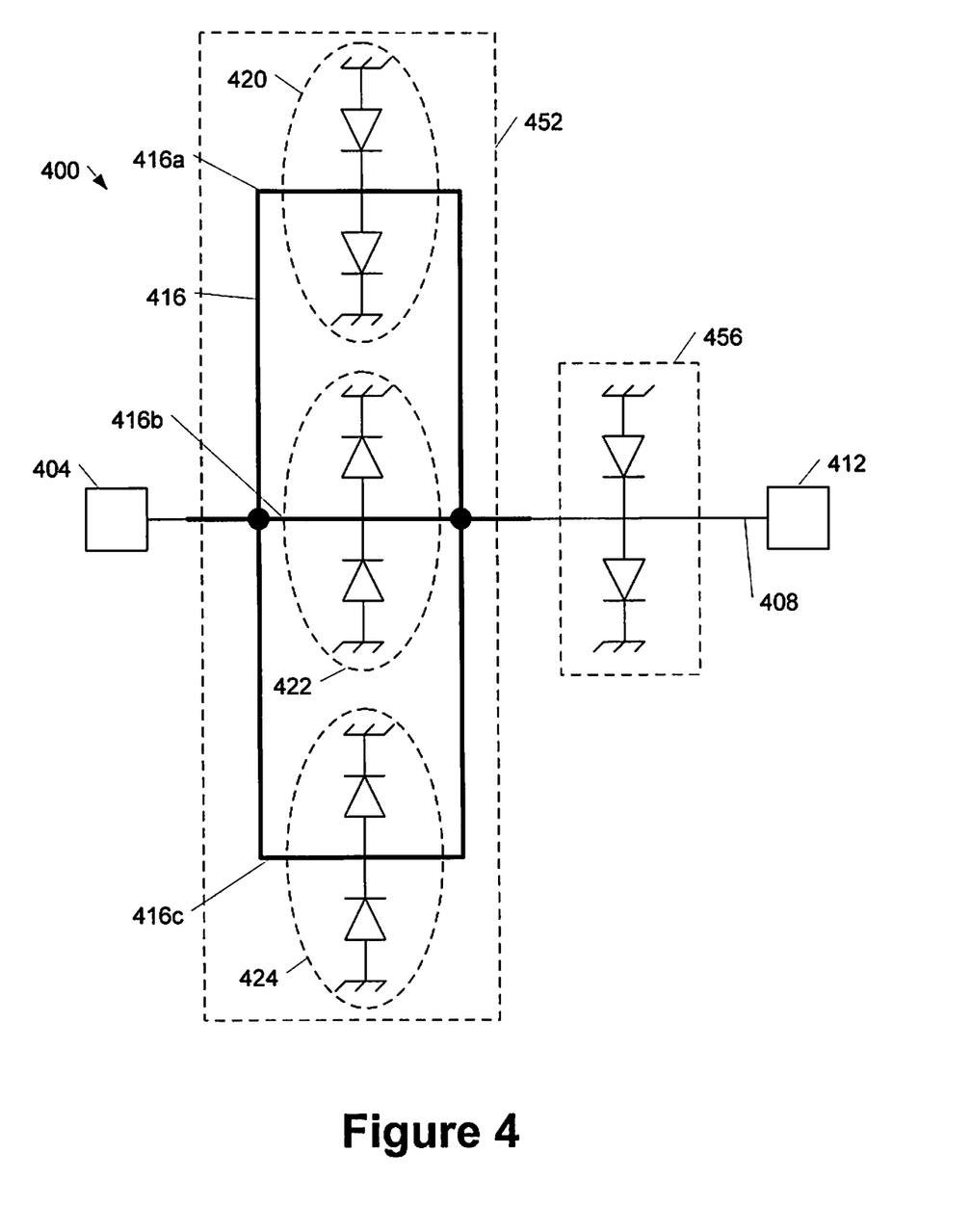
FIG. 4 illustrates a limiter circuit in accordance with some embodiments.

FIG. 4 illustrates a limiter 400 in accordance with some embodiments. Except as otherwise noted, the limiter 400 may be similar to, and substantially interchangeable with, limiters 100, 200, or 300.

Similar to limiter 300, limiter 400 may include a first stage 452 coupled with an input node 404 and a second stage 456 coupled with an output node 412. The second stage 456 may be similar to second stage 356 of limiter 300.

The first stage 452, similar to first stage 352, may include a power splitter 416 having a plurality of branches respectively coupled with antiparallel diode pairs. However, power splitter 416 includes three branches rather than the two shown in FIG. 3. Specifically, power splitter 416 includes branch 416*a* coupled with antiparallel diode pair 420, branch 416*b* coupled with antiparallel diode pair 422, and branch 416*c* coupled with antiparallel diode pair 424. The first stage 452 may work in a manner similar to first stage 352 except that the power may be distributed among the three branches, rather than just two. Thus, each antiparallel diode pair may see approximately one-third of the power of the input RF signal. The diodes of the antiparallel diode pairs may, therefore, be smaller and provide for higher cutoff frequencies and wider operating bandwidths. However, the first stage 452 may occupy relatively more die space than first stage 352. In various embodiments, various numbers of antiparallel diode pairs may be provided in the first stage.

Limiters of other embodiments may be configured to include additional antiparallel diode pairs similar to the limiter 400. For example, limiter 100 may include one or more antiparallel diode pairs in addition to antiparallel diode pairs 120 and 124 by the power splitter 116 having branches in addition to those shown in FIG. 1.

FIG. 5 illustrates a limiter 500 in accordance with some embodiments. Except as otherwise noted, the limiter 500 may be similar to, and substantially interchangeable with, limiters 100, 200, 300, or 400.

Similar to limiters 200, 300, and 400, the limiter 500 may include a first stage 552 and a second stage 556. However, in this embodiment, both the first stage 552 and the second stage 556 include respective power splitters. Specifically, the first stage 552 includes a power splitter 564, which may be similar to power splitter 316, and second stage 556 includes a power splitter 568, which may be similar to power splitter 216. The option of utilizing power splitters in the different stages of the limiter 500 may provide design flexibility to meet specific objectives of various embodiments. It will be understood that a variety of alternative configurations may be employed using the concepts described herein. For example, the first stage 552 and the second stage 556 may be switched.

Figure 6:
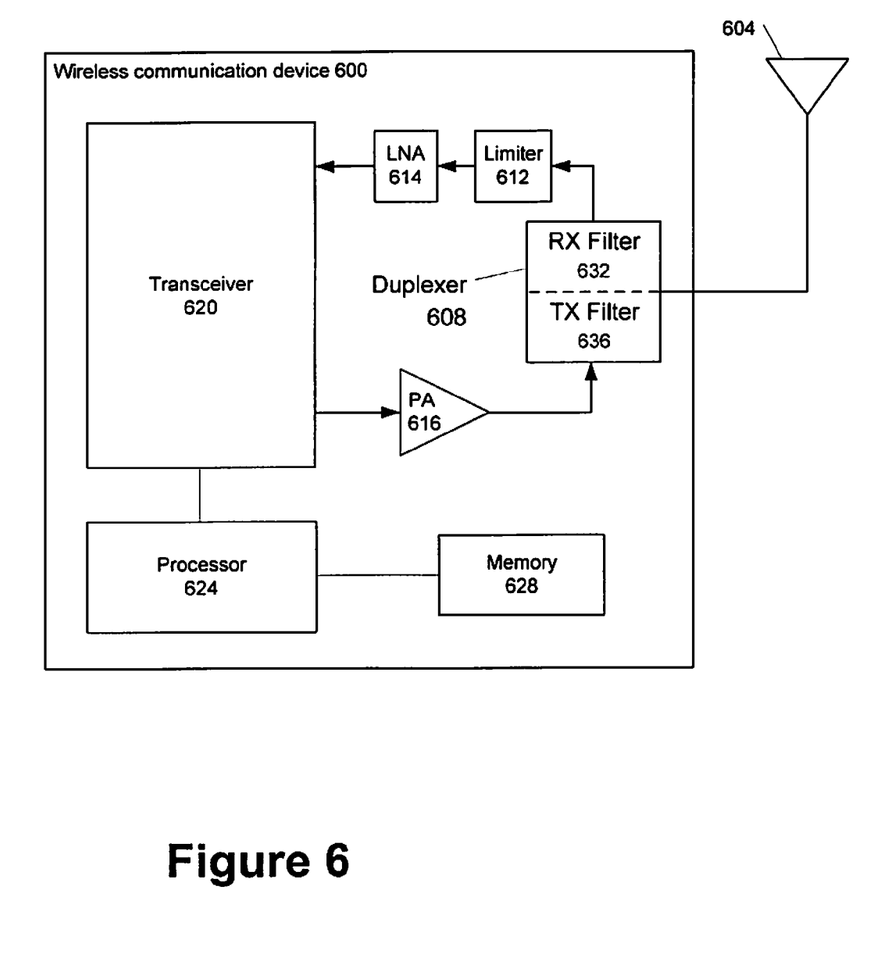
FIG. 6 illustrates a wireless communication device in accordance with some embodiments.

A wireless communication device 600 is illustrated in FIG. 6 in accordance with some embodiments. The wireless communication device 600 may have an antenna structure 604, a duplexer 608, a limiter 612, a low-noise amplifier (LNA) 614, a power amplifier (PA) 616, a transceiver 620, a processor 624, and a memory 628 coupled with each other at least as shown.

In various embodiments, the duplexer 608 may include a receive (RX) filter 632. The RX filter 632 and TX filter 636 may include various types of filter devices such as, but not limited to, surface acoustic wave devices and bulk acoustic wave devices.

The antenna structure 604 may include one or more antennas to transmit and receive radio frequency (RF) signals over the air. The antenna structure 604 may be coupled with the duplexer 608 that operates to selectively couple the antenna structure with the limiter 612 or the PA 616.

When transmitting outgoing RF signals, the TX filter 636 may couple the antenna structure 604 with the PA 616. The PA 616 may receive RF signals from the transceiver 620, amplify the RF signals, and provide the RF signals to the antenna structure 604 for over-the-air transmission.

When receiving incoming RF signals, the RX filter 632 may couple the antenna structure 604 with the limiter 612. The limiter 612, which may be similar to limiter 100, 200, 300, or 400, may pass through the RF signal to the LNA 614. The LNA 614 may amplify the RF signal to facilitate further processing and provide the amplified signal to the transceiver 620.

In some embodiments, large RF signals may be provided at an input of the limiter 612. These large RF signals may occur while the wireless communication device 600 is receiving, for example, the duplexer is coupling the antenna structure 604 to the limiter 612. These large RF signals may also occur when the wireless communication device 600 is transmitting, for example, reflection of the transmitted signal may cause it to occur in the receive chain. Regardless of the source, the limiter may operate to limit the input power of the RF signals to protect the LNA 614.

The processor 624 may execute a basic operating system program, stored in the memory 628, in order to control the overall operation of the wireless communication device 600. For example, the main processor 624 may control the reception of signals and the transmission of signals by transceiver 620. The main processor 624 may be capable of executing other processes and programs resident in the memory 628 and may move data into or out of memory 628, as desired by an executing process.

The transceiver 620 may receive outgoing data (e.g., voice data, web data, e-mail, signaling data, etc.) from the processor 624, may generate RF signals to represent the outgoing data, and provide the RF signals to the PA 616. Conversely, the transceiver 620 may receive RF signals from the LNA 614 that represent incoming data. The transceiver 620 may process the RF signals and send incoming signals to the processor 624 for further processing.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 600 is given by way of example and that, for simplicity and clarity, only so much of the construction and operation of the wireless communication device 600 as is necessary for an understanding of the embodiments is shown and described. Various embodiments contemplate any suitable component or combination of components performing any suitable tasks in association with wireless communication device 600, according to particular needs. Moreover, it is understood that the wireless communication device 600 should not be construed to limit the types of devices in which embodiments may be implemented.

Figure 7:
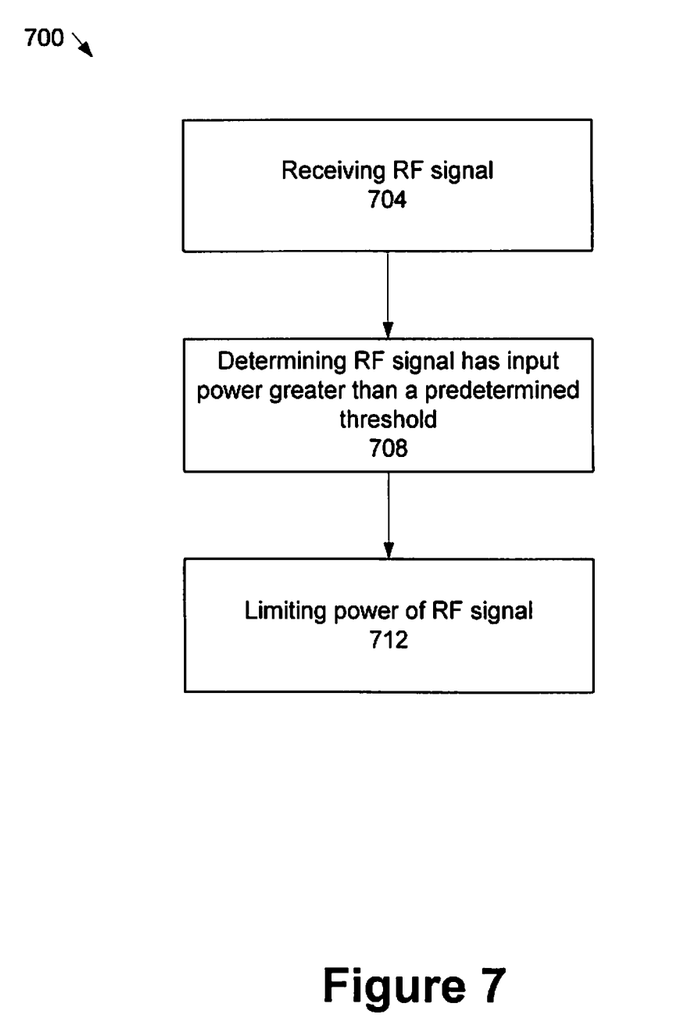
FIG. 7 is a flowchart depicting operation of a wireless communication device in accordance with some embodiments.

FIG. 7 is a flowchart illustrating an operation 700 of a limiter of a wireless communication device in accordance with some embodiments. The limiter may be similar to any of the limiters described herein.

At 704, the operation 700 may include receiving an RF signal. The receiving of an RF signal may be a result of an incoming signal received by an antenna structure of the device, or may be reflected from an outgoing signal.

At 708, the operation 700 may include determining that the RF signal has an input power greater than a predetermined threshold. The threshold may relate to thresholds and configurations of the diodes of the limiter.

At 712, the operation 700 may include limiting power of the RF signal. The limiting of the power of the RF signal may include reflecting and/or dissipating the power by the diodes of the limiter.

In some embodiments, the limiting functionality of the limiter may be a linear function. That is, the greater the power of the RF signal, the greater the amount of insertion loss provided by the limiter. In other embodiments, the limiting may be a non-linear function. For example, the limiter may either limit the power of the RF signal, if power at input is over a threshold, or not limit the power of the RF signal (other than a small degree of insertion loss inherently provided by the limiter), if power at input is below the threshold.

Various examples are described below.

Example 1 includes a limiter circuit comprising: an input node; a transmission line coupled with the input node; an output node coupled with the transmission line; a power splitter coupled with the transmission line between the input node and the output node; a first antiparallel diode pair coupled with the power splitter; and a second antiparallel diode pair coupled with the power splitter.

Example 2 includes limiter circuit of example1, wherein the first and second antiparallel diode pairs are configured to limit a power of a radio frequency signal on the transmission line.

Example 3 includes the limiter circuit of example1, wherein the first and second antiparallel diode pairs include vertical P-I-N diodes.

Example 4 includes the limiter circuit of example 3, wherein the vertical P-I-N diodes comprise gallium arsenide vertical P-I-N diodes.

Example 5 includes limiter circuit of example 1, further comprising: a first stage including the power splitter, the first antiparallel diode pair, and the second antiparallel diode pair; and a second stage including a third antiparallel diode pair, the third antiparallel diode pair having: a first diode with a cathode coupled with the transmission line and an anode coupled with ground or a voltage source; and a second diode with an anode coupled with the transmission line and a cathode coupled with ground or a voltage source.

Example 6 includes the limiter circuit of example 5, wherein the first diode is physically disposed on a first side of the transmission line and the second diode is physically disposed on a second side of the transmission line, which is opposite the first side.

Example 7 includes the limiter circuit of example 1, further comprising: an input stage including the power splitter, the first antiparallel diode pair, and the second antiparallel diode pair; and one or more additional stages, wherein individual stages of the one or more additional stages include antiparallel diode pairs coupled with the transmission line.

Example 8 includes the limiter circuit of example 7, wherein at least one of the one or more additional stages includes a power splitter.

Example 9 includes the limiter circuit of example 1, wherein the first antiparallel diode pair is physically disposed on a first side of the transmission line and the second antiparallel diode pair is physically disposed on a second side of the transmission line, which is opposite the first side.

Example 10 includes the limiter circuit of example 1, wherein the power splitter comprises a first node physically disposed on the first side and the first antiparallel diode pair includes a first diode with a cathode coupled with the first node and an anode coupled with the first node.

Example 11 includes the limiter circuit of example 10, wherein the power splitter comprises a second node physically disposed on the second side and the second antiparallel diode pair includes a third diode with a cathode coupled with the second node and an anode coupled with the first node.

Example 12 includes a limiter circuit comprising: an input node; a power splitter coupled with the input node and having a plurality of parallel branches; a plurality of antiparallel diode pairs respectively coupled with the plurality of parallel branches of the power splitter; and an output node coupled with the power splitter.

Example 13 includes the limiter circuit of 12, wherein the plurality of antiparallel diode pairs are configured to limit a power of a radio frequency signal provided to the output node.

Example 14 includes the limiter circuit of example 12, wherein the plurality of antiparallel diode pairs include vertical P-I-N diodes.

Example 15 includes the limiter circuit of example 14, wherein the vertical P-I-N diodes comprise gallium arsenide vertical P-I-N diodes.

Example 16 includes the limiter circuit of example 12, further comprising: a transmission line coupled with the output node and the power splitter; a first stage including the power splitter and the plurality antiparallel diode pairs; and a second stage including an antiparallel diode pair having: a first diode with a cathode coupled with the transmission line and an anode coupled with ground or a voltage source; and a second diode with an anode coupled with the transmission line and a cathode coupled with ground or a voltage source.

Example 17 includes the limiter circuit of example 12, further comprising: an input stage including the power splitter, the first antiparallel diode pair, and the second antiparallel diode pair; and one or more additional stages, wherein individual stages of the one or more additional stages include antiparallel diode pairs coupled with the transmission line.

Example 18 includes the limiter circuit of example 12, wherein the power splitter comprises at least three parallel branches and at least three antiparallel diode pair respectively coupled with the at least three parallel branches.

Example 19 includes a wireless communication device comprising: an antenna structure; a low noise amplifier (LNA) to amplify received RF signals; and a limiter coupled with the LNA and the antenna structure, the limiter including: an input node; a power splitter coupled with the input node; and a plurality of antiparallel diode pairs coupled with the power splitter and configured to limit a power of RF signals provided to the LNA.

Example 20 includes the wireless communication device of example 19, wherein the plurality of antiparallel diode pairs include gallium arsenide vertical P-I-N diodes.

Example 21 includes the wireless communication device of example 19, wherein the power splitter comprises a plurality of parallel branches respectively coupled with the plurality of antiparallel diode pairs.

Example 22 includes the wireless communication device of example 19, wherein the limiter is a variable input power limiter.

Example 23 includes the wireless communication device of example 22, wherein diodes of the plurality of antiparallel diode pairs are coupled with a positive or negative voltage supply to reverse or forward bias the diodes.

Example 24 includes the wireless communication device of example 19, wherein: a first diode of a first antiparallel diode pair of the plurality of antiparallel diode pairs is a different size than a second diode of the first antiparallel diode pair; and a first diode of a second antiparallel diode pair of the plurality of antiparallel diode pairs is a different size than a second diode of the second antiparallel diode pair.

Example 25 includes the wireless communication device of example 19, wherein the first diodes of the first and second antiparallel diode pairs are configured to limit RF signals over a first input power threshold and the second diodes of the first and second antiparallel diode pairs are configured to limit RF signals over a second input power threshold, which is less than the first input power threshold.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A limiter circuit comprising:
   a transmission line coupled between an input node and an output node;
   a power splitter having a first node, a second node, and a third node that is coupled to the transmission line;
   a first antiparallel diode pair coupled between the first node and ground or a voltage source; and
   a second antiparallel diode pair coupled between the second node and the ground or voltage source.

2. The limiter circuit of claim 1 wherein the first antiparallel diode pair and the second antiparallel diode pair are configured to limit a power of a radio frequency (RF) signal on the transmission line.

3. The limiter circuit of claim 1 wherein the first antiparallel diode pair and the second antiparallel diode pair include vertical P-I-N diodes.

4. The limiter circuit of claim 3 wherein the vertical P-I-N diodes comprise gallium arsenide vertical P-I-N diodes.

5. The limiter circuit of claim 1 further comprising:
   a first stage including the power splitter, the first antiparallel diode pair, and the second antiparallel diode pair; and
   a second stage including a third antiparallel diode pair, the third antiparallel diode pair having:
      a first diode with a cathode coupled with the transmission line and an anode coupled with the ground or the voltage source; and
      a second diode with an anode coupled with the transmission line and a cathode coupled with the ground or the voltage source.

6. The limiter circuit of claim 5 wherein the first diode is physically disposed on a first side of the transmission line and the second diode is physically disposed on a second side of the transmission line, which is opposite the first side.

7. The limiter circuit of claim 5 wherein the first stage and the second stage are configured to limit a power of a radio frequency (RF) signal on the transmission line and the second stage is coupled approximately one-quarter wavelength of the RF signal from where the first stage is coupled with the transmission line.

8. The limiter circuit of claim 7 wherein the first antiparallel diode pair and the second antiparallel diode pair include vertical P-I-N diodes.

9. The limiter circuit of claim 5 wherein the first antiparallel diode pair and the second antiparallel diode pair include vertical P-I-N diodes.

10. The limiter circuit of claim 1 further comprising:
    an input stage including the power splitter, the first antiparallel diode pair, and the second antiparallel diode pair; and
    one or more additional stages, wherein individual stages of the one or more additional stages include antiparallel diode pairs coupled with the transmission line.

11. The limiter circuit of claim 10 wherein at least one of the one or more additional stages includes a power splitter.

12. The limiter circuit of claim 11 wherein:
    the first stage and an additional stage are configured to limit a power of a radio frequency (RF) signal on the transmission line;
    the additional stage includes a second power splitter; and
    the additional stage is coupled approximately one-quarter wavelength of the RF signal from where the first stage is coupled with the transmission line.

13. The limiter circuit of claim 12 wherein the first antiparallel diode pair and the second antiparallel diode pair include vertical P-I-N diodes.

14. The limiter circuit of claim 12 wherein:
    the first antiparallel diode pair is physically disposed on a first side of the transmission line and the second antiparallel diode pair is physically disposed on a second side of the transmission line, which is opposite the first side;
    the first node is physically disposed on the first side and the first antiparallel diode pair includes a first diode with a cathode coupled with the first node and an anode coupled with the first node; and the second node is physically disposed on the second side and the second antiparallel diode pair includes a third diode with a cathode coupled with the second node and an anode coupled with the first node.

15. The limiter circuit of claim 10 wherein:

the first antiparallel diode pair is physically disposed on a first side of the transmission line and the second antiparallel diode pair is physically disposed on a second side of the transmission line, which is opposite the first side;

the first node is physically disposed on the first side and the first antiparallel diode pair includes a first diode with a cathode coupled with the first node and an anode coupled with the first node; and the second node is physically disposed on the second side and the second antiparallel diode pair includes a third diode with a cathode coupled with the second node and an anode coupled with the first node.

16. The limiter circuit of claim 1 wherein the first antiparallel diode pair is physically disposed on a first side of the transmission line and the second antiparallel diode pair is physically disposed on a second side of the transmission line, which is opposite the first side.

17. The limiter circuit of claim 16 wherein the first node is physically disposed on the first side and the first antiparallel diode pair includes a first diode with a cathode coupled with the first node and an anode coupled with the first node.

18. The limiter circuit of claim 17 wherein the second node is physically disposed on the second side and the second antiparallel diode pair includes a third diode with a cathode coupled with the second node and an anode coupled with the first node.

19. The limiter circuit of claim 18 wherein at least one diode within the first antiparallel diode pair and the second antiparallel diode pair comprise a plurality of diodes that are coupled in series.

20. The limiter circuit of claim 1 wherein at least one diode within the first antiparallel diode pair and the second antiparallel diode pair comprises a plurality of diodes that are coupled in series.

* * * * *